(12) United States Patent
Hayashi et al.

(10) Patent No.: US 6,185,973 B1
(45) Date of Patent: Feb. 13, 2001

(54) ROLLING MILL FOR METAL FOIL

(75) Inventors: Kazuhito Hayashi; Hidenori Hayashi, both of Ibaraki-ken; Shigeharu Yamauchi; Hiroyuki Hayashi, both of Ichikawa, all of (JP)

(73) Assignee: World Machinery Co., Ltd., Ichikawa (JP)

( * ) Notice: Under 35 U.S.C. 154(b), the term of this patent shall be extended for 0 days.

(21) Appl. No.: 09/464,384

(22) Filed: Dec. 16, 1999

(30) Foreign Application Priority Data

Dec. 7, 1999 (JP) .................................................. 11-347081

(51) Int. Cl.[7] ...................................................... B21B 13/14
(52) U.S. Cl. ............................................................. 72/242.4
(58) Field of Search ............................... 72/242.2, 242.4, 72/236

(56) References Cited

U.S. PATENT DOCUMENTS

| | | | |
|---|---|---|---|
| 2,368,030 | * | 1/1945 | Larsson ................................. 72/242.4 |
| 3,096,672 | * | 7/1963 | Jones ................................... 72/242.4 |
| 3,921,425 | * | 11/1975 | Sendzimir ............................ 72/242.4 |
| 4,510,784 | * | 4/1985 | Hsu ........................................ 72/201 |
| 4,706,480 | * | 11/1987 | Svatos ................................... 72/236 |

* cited by examiner

Primary Examiner—Rodney A. Butler
(74) Attorney, Agent, or Firm—Oblon, Spivak, McClelland, Maier & Neustadt, P.C.

(57) ABSTRACT

A rolling mill for metal foil includes a pair of work rollers having axes in parallel to each other for subjecting a sheet material being supplied therebetween to strip processing, two pairs of intermediate rollers arranged so that the intermediate rollers of each pair are in contact with one of the work rollers and have axes in parallel to the axis of the contacting work roller, and two pairs of backup rollers arranged so that the backup rollers of each pair are respectively in contact with one pair of the intermediate rollers. Each pair of intermediate rollers and the pair of backup rollers in contact with the pair of intermediate rollers impart roll load to the work roller in contact with the pair of intermediate rollers. The rolling mill enables the production of large-width metal foil too thin to be self-supportable in shape with ease and high precision.

11 Claims, 11 Drawing Sheets

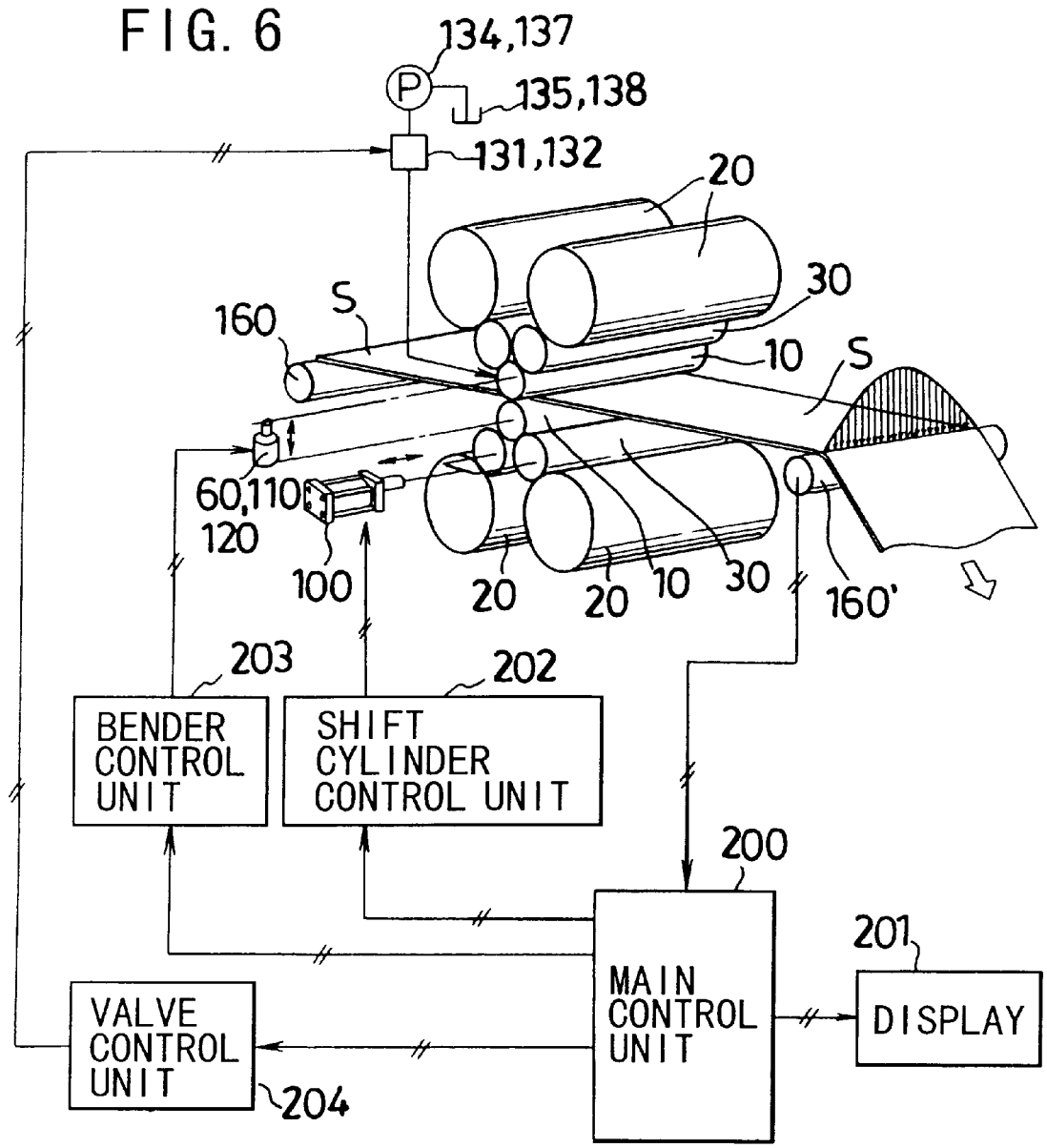

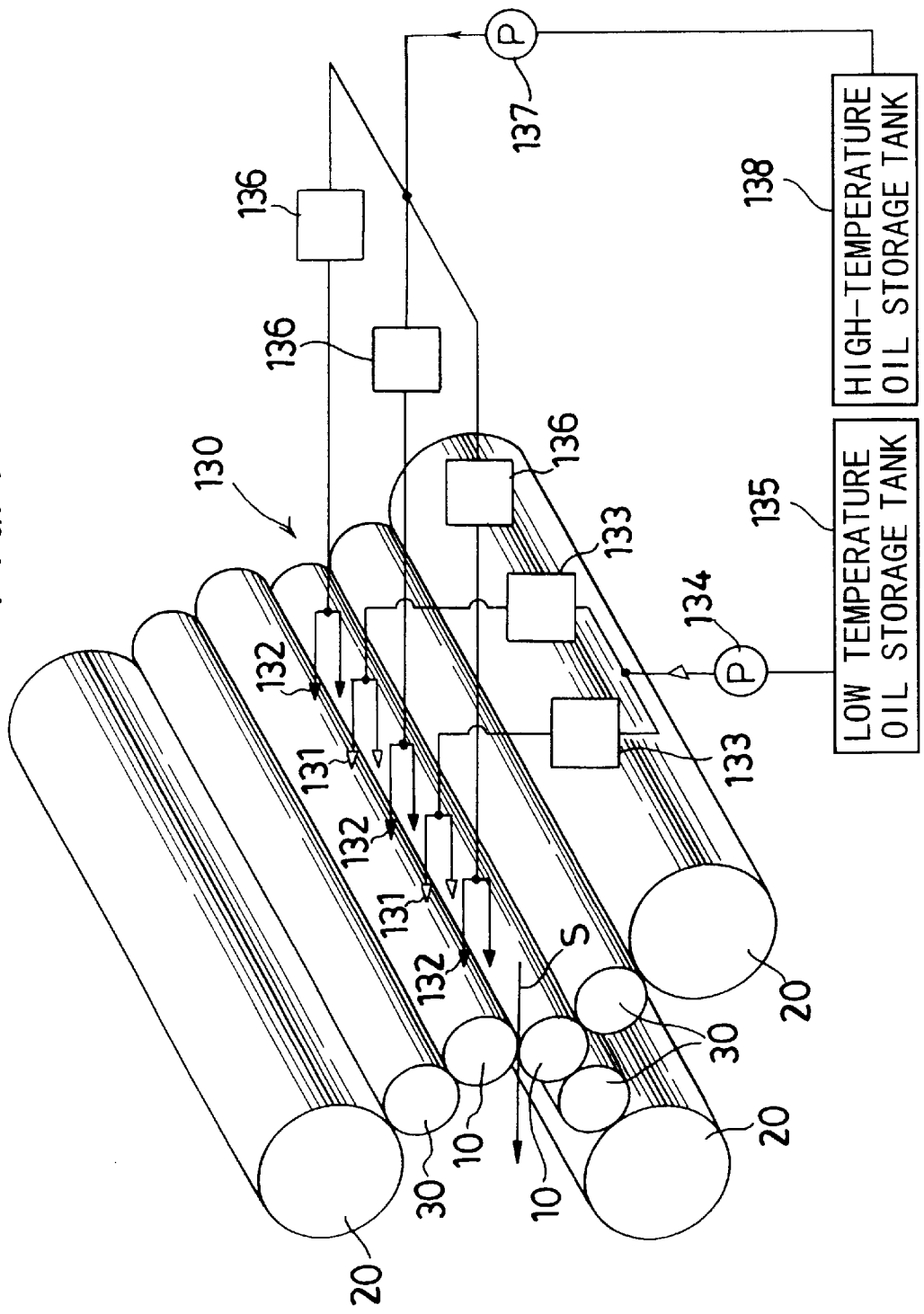

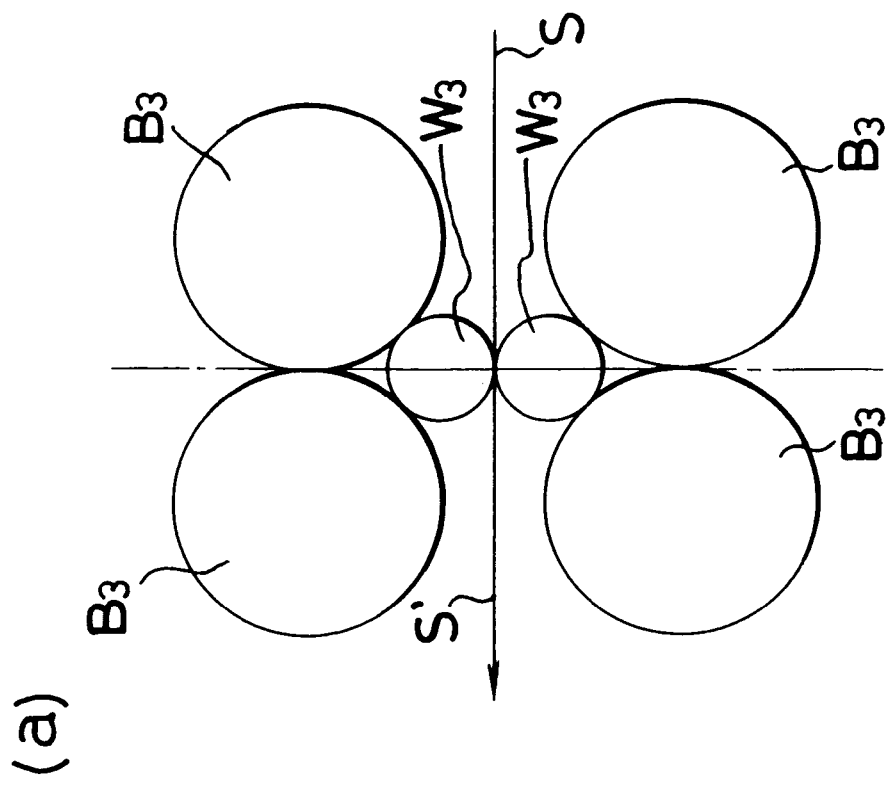
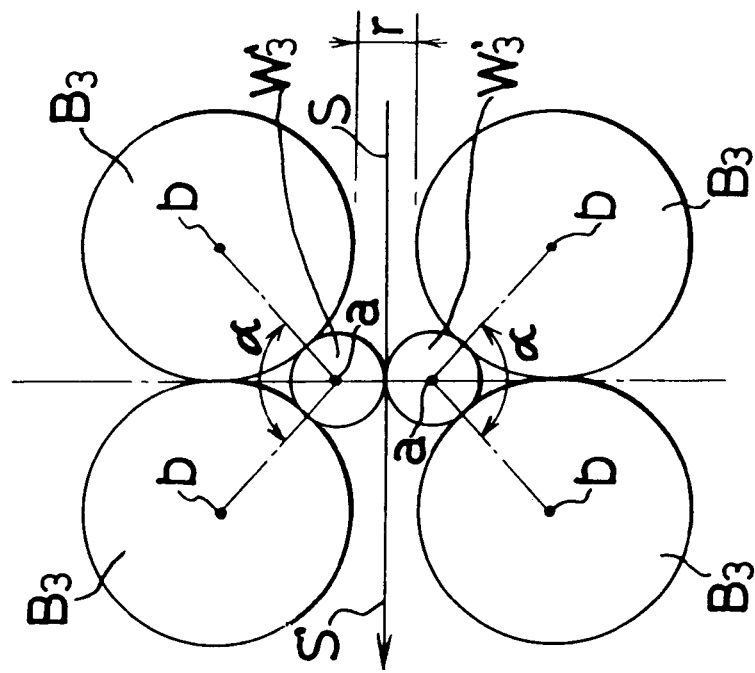
FIG.11(b) PRIOR ART
FIG.11(a) PRIOR ART

ROLLING MILL FOR METAL FOIL

BACKGROUND OF THE INVENTION

1. Field of the Invention

The present invention relates to a rolling mill for metal foil, that is used for subjecting a sheet material to strip processing into a rolled material by supplying it between a pair of work rollers.

2. Description of the Prior Art

FIGS. 10(a) to 10(d) are schematic views each showing the arrangement of rollers of a conventionally known rolling mill.

The rolling mill shown in FIG. 10(a) [hereinafter referred to as the two-high rolling mill] has a fundamental structure and comprises a pair of upper and lower work rollers $W_1$ between which a sheet material S to be rolled is supplied for rolling the sheet material.

The rolling mill shown in FIG. 10(b) [hereinafter referred to as the four-high rolling mill] comprises a pair of upper and lower work rollers $W_2$ and a pair of backup rollers $B_2$ for supporting the work rollers thereon. Since the backup rollers $B_2$ of the four-high rolling mill reduce flexing of the work rollers $W_2$, the work rollers $W_2$ can be made smaller in diameter than those of the two-high rolling mill.

The rolling mill shown in FIG. 10(c) [hereinafter referred to as the six-high rolling mill] comprises a pair of upper and lower work rollers $W_3$ and two pairs of forward and backward backup rollers $B_3$ for supporting the work rollers thereon. The work rollers $W_3$ can be made much smaller in diameter than those of the four-high rolling mill.

The rolling mill shown in FIG. 10(d) [hereinafter referred to as the twelve-high rolling mill] comprises a pair of upper and lower work rollers $W_4$, two pairs of forward and backward intermediate rollers $M_4$ for supporting the work rollers thereon, and two pairs of three reinforcing bearing rollers $R_4$ for supporting the pair of intermediate rollers $M_4$ thereon. Each reinforcing bearing roller $R_4$ comprises a plurality of roller bearings RB arranged side by side. Owing to the structure having the work rollers $W_4$ supported by the intermediate rollers $M_4$ and reinforcing bearing rollers $R_4$, the work rollers $W_4$ can be made smallest in diameter.

The smaller the work roller diameter, from that shown in FIG. 10(a) to that shown in FIG. 10(d), the smaller the power required. This not only enables reduction of rolling mill size and lowering of manufacturing cost, but also becomes an important factor for making a sheet material S to be rolled thinner. This has been confirmed from the theoretical point of view and the viewpoint of actual results.

In the various kinds of rolling mills cited above, the thickness of a sheet material S after being rolled can be made smaller in proportion as the diameter of the work rollers becomes smaller. According to the twelve-high rolling mill, whose work rollers are smallest in diameter, it is possible to obtain a rolled product having a sheet thickness of about 50 to about 9 $\mu$m if the width of the rolled product is not more than 600 mm.

Furthermore, according to the twelve-high rolling mill, since the plurality of roller bearings RB constituting each reinforcing bearing roller $R_4$ are set to be independently movable in their diameter directions, the thickness of a sheet material S to be rolled can be easily controlled in its width direction by adjusting the diameter-direction movement of the roller bearings, resulting in advantages in quality of the rolled product.

Continuing pronounced advances in the field of electronic technology have led to increasing demand for further enhancement of the performance of rolled products obtained by the aforementioned rolling mills. Higher performance products are needed in connection with, for example, rolled foil of copper alloy indispensable to the realization of multilayered prints on printed circuit boards or a smaller thickness of printed circuit boards; miniaturization, larger capacity and longer service life of secondary battery products; and higher density and integration of semiconductor products. In such applications, a thickness of 9 to 3 $\mu$m is required and from the standpoint of enhancing yield, a width exceeding 750 mm is necessary.

These requirements can conceivably be met by making the diameter of the work rollers $W_4$ of the twelve-high rolling mill smaller by increasing the rigidity or number of the intermediate rollers and reinforcing bearing rollers.

However, this solution would considerably increase the weight or number of the rollers involved in the strip processing with the rolling mills and consequently increases the mechanical loss and the influence of inertial weight. As a result, it would become very difficult to precisely control driving of the rollers, leading to inferior products passed between the work rollers, that not only have lengthwise elongation, intermediate elongation, composite elongation and one-sided elongation, but also exhibit easy fracture. Therefore, this solution cannot be put into practical use. When a product is fractured, there is a possibility of the fractions marring the peripheral surfaces of the rollers when they pass between the rollers. The subsequent repair requires much time. That is to say, a material for a rolled product of self-supportable shape having a width of not more than 600 mm and a thickness of not less than about 50 to about 9 $\mu$m can be rolled within the scope of conventional rolling mill technologies or an extension of such technologies. However, these same technologies are the main obstacle to production of rolled metal foil difficult to produce in self-supportable shape having a thickness of 9 to 3 $\mu$m.

In view of the above, the inventors conceived a six-high rolling mill that would be inferior to the twelve-high rolling mill in suppression of work roller flexure, but superior thereto in accuracy of roller-drive control. They repeatedly carried out experiments, analyses and improvements as regards the limits of rolled metal foil production using the six-high rolling mill and consequently were able to obtain some uniform results. That is to say, they found that it was required to make the diameter of the work rollers smaller, accurately control driving of the rollers and guide both the material to be rolled and the rolled product in the immediate vicinity of the work rollers in order to produce rolled metal foil that is too thin and too wide to be self-supportable in shape. They actually confirmed that such an improved six-high rolling mill for metal foil could produce a rolled product thinner than the limits of rolled material production using the twelve-high rolling mill, though not reaching the aforementioned currently demanded level.

In the improved six-high rolling mill for metal foil, however, when the diameter of the work rollers in FIG. 11(a) is reduced to that of the work rollers in FIG. 11(b) ($W_3 \rightarrow W_3'$) so that the demanded level can be attained, the problems listed below still remain due to restrictions on the arrangement of the work rollers $W_3$ and backup rollers $B_3$.

① The interval r between the pair of backup rollers $B_3$ opposed across a passing line for a material S to be rolled is reduced with decreasing work-roller diameter to that of the work rollers $W_3'$, so that there is a possibility of the backup rollers $B_3$ coming into contact with each other. This means that reduction of the work roller diameter to that of the work rollers $W_3'$ reaches a limit.

② Mutual approaching of the backup rollers $B_3$ makes it difficult to secure spaces for disposing guides for the material S to be rolled and the rolled product in the immediate vicinity of the work rollers $W_3'$.

③ The interior angle α formed by connecting the axis a of a work roller $W_3'$ to the axes b of the contacting backup rollers $B_3$ has to be set obtuse, and the reaction force of the roll load applied onto the backup rollers $B_3$ is increased. This is disadvantageous in the aspect of controlling the roll load and leads to a possibility of the bearing portions for the backup rollers $B_3$ being damaged in an early stage.

These problems can be solved to some extent by making the diameter of the backup rollers $B_3$ smaller. However, since the backup rollers $B_3$ are required to have desirable rigidity so that they can prevent the work rollers $W_3'$ from being flexed, they fail to fulfill their own functions when formed to a small diameter.

The main object of the present invention under these circumstances is to provide a rolling mill for metal foil that enables easy and precise production of even metal foil too thin and too wide to be self-supportable in shape.

To be specific, the object of the present invention is to provide a rolling mill for metal foil that can produce rolled metal foil of extremely small thickness and large width with spaces secured for disposing guides for a material to be rolled and a rolled product in the immediate vicinity of a pair of work rollers without reducing the diameter of backup rollers.

Another object of the present invention is to provide a rolling mill for metal foil, in which the interior angle formed by connecting the axis of a work roller to the axes of contacting backup rollers can be made acute and the roll load can be controlled with ease.

SUMMARY OF THE INVENTION

To attain the above objects, the present invention provides a rolling mill for metal foil, comprising a pair of work rollers having axes in parallel to each other for subjecting a sheet material being supplied therebetween to strip processing, two pairs of intermediate rollers arranged so that the intermediate rollers of each pair are in contact with one of the work rollers and have axes in parallel to the axis of the contacting work roller, and two pairs of backup rollers arranged so that the backup rollers of each pair are respectively in contact with one pair of the intermediate rollers, whereby each pair of intermediate rollers and the pair of backup rollers in contact with the pair of intermediate rollers impart roll load to the work roller in contact with the pair of intermediate rollers.

In the aforementioned arrangement, the interior angle formed by connecting the axis of each work roller to the axes of each pair of contacting intermediate rollers is preferably made acute and the axes of each pair of backup rollers in contact with each pair of intermediate rollers fall preferably within the range of the acute interior angle. Furthermore, each intermediate roller can be set movable axially in accordance with the deflection in thickness of the material being rolled.

An unwinder on which a material to be rolled is wound up and a rewinder for winding a rolled product thereabouts can be disposed respectively on the upstream and downstream sides in the vicinity of the pair of work rollers.

Guide means are preferably disposed between the unwinder and the pair of work rollers and between the rewinder and the pair of work rollers, i.e. in the immediate vicinity of the pair of work rollers. Each guide means may be constituted of an indirect drive roller comprising a center shaft that is rotated by driving an air motor and a hollow roller that surrounds the center shaft and is rotated by receiving the rotation of the center shaft.

Jetting means for jetting a coolant can be disposed on the upstream side in the immediate vicinity of the pair of work rollers. The jetting means preferably comprises a plurality of jetting means for a relatively high temperature coolant and a plurality of jetting means for a relatively low temperature coolant, that are arranged alternately along the axes of the work rollers.

According to the present invention, since roll load is imparted to the pair of work rollers whose axes are in parallel to each other by the two pairs of intermediate rollers, each pair being in contact with one work roller, and the two pairs of backup rollers, each pair being in contact with one pair of intermediate rollers, a large space can be secured between the backup rollers opposed to each other across a material to be rolled without changing the diameter of the backup rollers even when the diameter of the work rollers is made smaller and, at the same time, the material to be rolled and a rolled product can be guided in the immediate vicinity of the work rollers.

In addition, since the intermediate rollers are interposed between the work rollers and the backup rollers, the interior angle obtained by connecting the axis of each work roller to the axes of the pair of contacting intermediate rollers can be set acute even when the diameter of the work rollers is made smaller. This is advantageous in controlling work roll driving because the reaction force of the roll load applied to these rollers becomes small.

In comparison with the twelve-high rolling mill, the rolling mill according to the present invention is highly advantageous in terms of the mechanical loss and the inertial weight and enables roller driving to be accurately controlled with ease. For this reason, there is no possibility of a rolled product passed between the work rollers exhibiting defects such as excess longitudinal, central, one-sided or composite elongation and easy cutoff. Even if a rolled product should be severed, since the number of rollers used in the present invention is smaller than that of the twelve-high rolling mill, the time required for restoring operation can be shortened.

According to the present invention, therefore, it is possible to easily produce even rolled metal foil as thin as 9 μm to 3 μm with high precision.

The above and other objects, characteristic features and advantages of the present invention will become apparent from the description to be given hereinbelow with reference to the accompanying drawings.

BRIEF DESCRIPTION OF THE DRAWINGS

FIG. 6 is a block diagram of a metal foil thickness controller applied to the rolling mill for metal foil in FIG. 1.

FIG. 7 is a circuit view showing a cooling-lubricating system applied to the rolling mill for metal foil in FIG. 1.

FIG. 11(a) is a schematic view showing the arrangement of rollers of the prior art six-high rolling mill in FIG. 10(c).

FIG. 11(b) is a schematic view showing the prior art six-high rolling mill in FIG. 11(a), with work rollers reduced in diameter.

DESCRIPTION OF THE PREFERRED EMBODIMENTS

Figure 1:
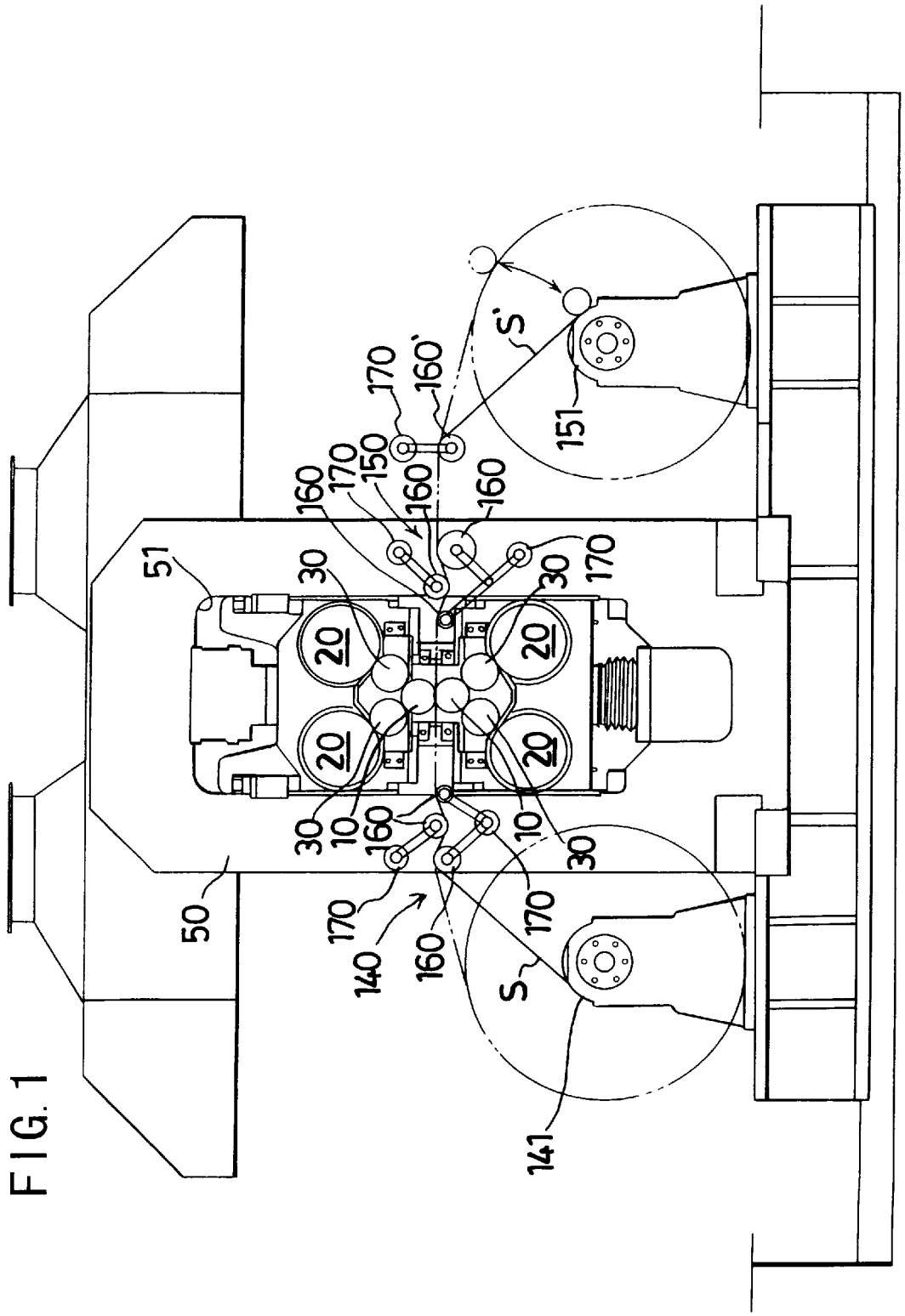
FIG. 1 is a schematic front view showing one embodiment of a rolling mill for metal foil according to the present invention.
Figure 2:
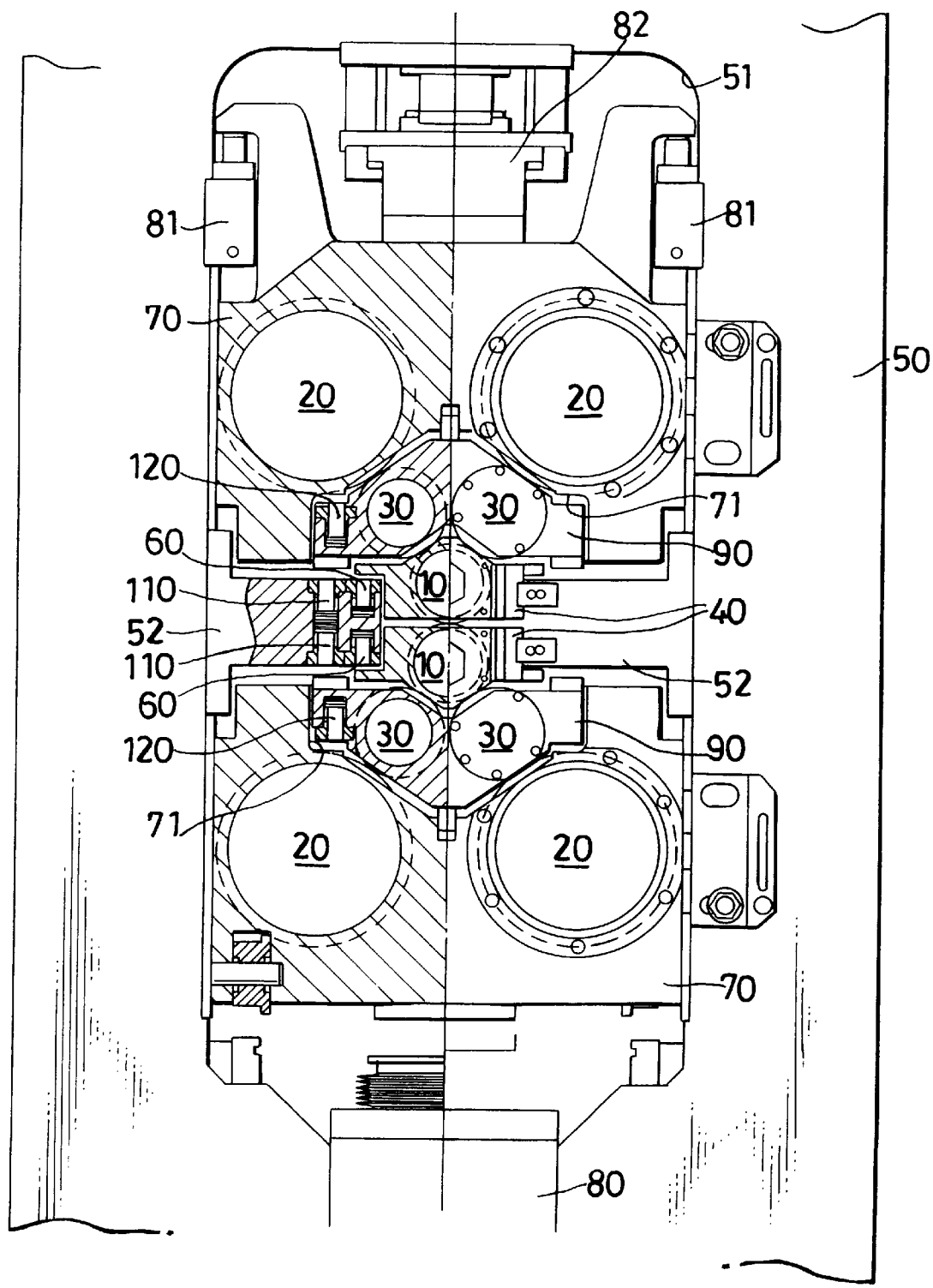
FIG. 2 is an enlarged front view showing the principal parts of the rolling mill for metal foil in FIG. 1, with one half thereof sectioned.
Figure 3:
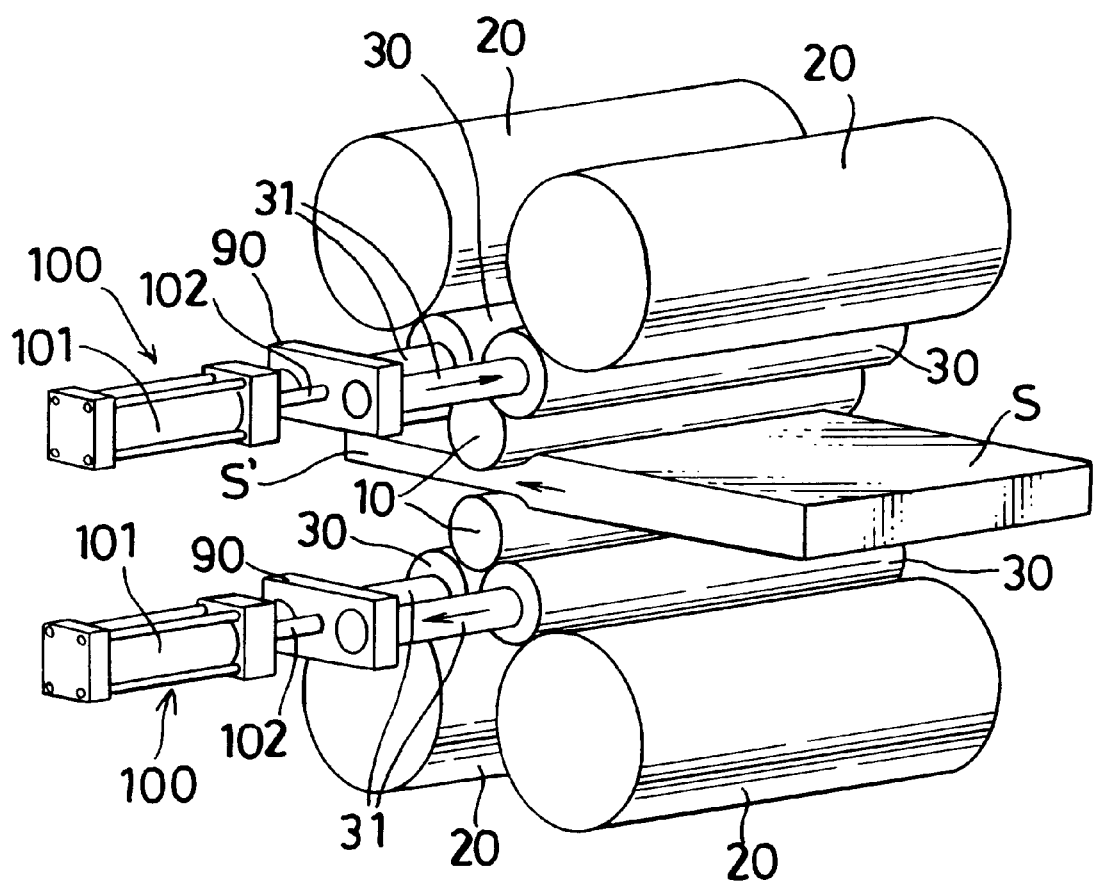
FIG. 3 is a schematic perspective view showing the arrangement of rollers of the rolling mill for metal foil in FIG. 1.

Now, the present invention will be described in detail with reference to one embodiment shown in the drawings.

FIG. 1 through FIG. 4 illustrate one embodiment of a metal foil rolling mill according to the present invention. This rolling mill is advantageously applicable to the production of rolled copper alloy foil having an extremely small thickness (9 to 3 $\mu$m) that is required for forming a multilayered, small-thickness printed circuit board, a small-sized, high-capacity, long service-life secondary battery product, a highly integrated semiconductor product, etc. and is a ten-high rolling mill equipped with a pair of upper and lower work rollers 10, two pairs of upper and lower backup rollers 20 and two pairs of upper and lower intermediate rollers 30.

Each work roller 10 comprises a cylindrical body 12 having a uniform outside diameter and a pair of necks 11 formed on the opposite ends of the cylindrical body and having a smaller outside diameter, and is rotatably supported by first roller chocks 40 via the necks 11.

The first roller chocks 40 are separate members from the work rollers 10 and are vertically arranged between a pair of support brackets 52 projecting from an opening 51 of a housing 50, with the axes of the work rollers 10 held horizontal and disposed in one same vertical plane. The first roller chocks 40 are slidable vertically relative to the housing 50 and serve to move the pair of work rollers 10 toward or away from each other, with the posture of each work roller maintained.

A work roller increasing bender 60 is interposed between each first roller chock 40 and the support bracket 52.

Each backup roller 20 comprises, similarly to the work roller 10, a cylindrical body 22 having a uniform outside diameter and a pair of necks 21 formed on the opposite ends of the cylindrical body and having a smaller outside diameter. As is clear from the drawings, the necks 21 and cylindrical bodies 22 of the backup rollers 20 have larger diameters than those of the work rollers 10, and therefore have high rigidity. The diameter of the backup roller 20 is, to give a specific example, 2.5 to 3.5 times the diameter of the work roller 10. The cylindrical body 22 of the backup roller 20 is substantially the same in length as that of the work roller 10. Each backup roller 20 is rotatably supported by second roller chocks 70 via the necks 21 at a position outward of the work roller 10.

The second roller chocks 70 are separate members from the pair of upwardly positioned backup rollers 20 (hereinafter referred to as the upper backup rollers) and from the pair of downwardly positioned backup rollers 20 (hereinafter referred to as the lower backup rollers). The pair of upper backup rollers 20 and the pair of lower backup rollers 20 are vertically disposed in the opening 51 of the housing 50, with the axes of each a disposed in one same horizontal plane and the axes of each upper backup roller and each lower backup roller disposed in one same vertical plane. Similarly to the first roller chocks 40, the second roller chocks 70 are slidable vertically relative to the housing 50 and serve to move each upper backup roller 20 and each lower backup roller 20 toward or away from each other, with the posture of each backup roller maintained.

A hydraulic cylinder actuator 80 is interposed between the housing 50 and the downwardly positioned second roller chocks 70 for imparting vertical roll load to these second roller chocks 70, and a pair of balance cylinders 81 are interposed between the housing 50 and the upwardly positioned second roller chocks 70. Each second roller chock 70 is formed at its end portion facing the first roller chock 40 with a notch 71 for accommodating a third roller chock 90 that will be described later. Denoted by reference numeral 82 in the drawing is a load cell interposed between the housing 50 and the upwardly positioned second roller chocks 70 for measuring the roll load imparted by the hydraulic cylinder actuator 80.

Each intermediate roller 30 comprises a tapered cylindrical body 32 having its outside diameter reduced gradually toward one end side and a pair of necks 31 connected to the opposite ends of the tapered cylindrical body 32 via tapered parts 33 and 34, the diameter of each of which increases toward the end of the tapered cylindrical body 32. As is clear from the drawings, the minimum outside diameter of the tapered cylindrical body 32 of the intermediate roller 30 is much smaller than that of the cylindrical body 22 of the backup roller 20 and falls in the range of the same diameter as to substantially twice the diameter of the cylindrical body 12 of the work roller 10. The cylindrical body 32 of the intermediate roller 30 has substantially the same length as that of the work roller 10. Each intermediate roller 30 is rotatably supported between a work roller 10 and a backup roller 20 by one of the third roller chocks 90 via the necks 31, with each pair of laterally disposed cylindrical bodies 30 tapered in the same direction and each pair of vertically disposed cylindrical bodies 30 tapered in the opposite directions.

The third roller chocks 90 are separate members from the pair of upwardly positioned intermediate rollers 30 (hereinafter referred to as the upper intermediate rollers) and from the downwardly positioned intermediate rollers 30 (hereinafter referred to as the lower intermediate rollers). Each third roller chock 90 is accommodated in the notch 71 of a second roller chock 70, with the axes of each pair of upper intermediate rollers and lower intermediate rollers disposed in one same horizontal plane and the axes of each pair of upper and lower intermediate rollers disposed in one same vertical plane. The third roller chocks 90 are slidable vertically relative to the second roller chocks 70 and serve to move the upper intermediate rollers 30 and the lower intermediate rollers 30 toward or away from each other, with the posture of each intermediate roller 30 maintained.

A shift cylinder actuator 100 is interposed between the housing 50 and each of the pair of third roller chocks 90 disposed on the same side for the upper intermediate rollers 30 and the lower intermediate rollers 30, respectively. The shift cylinder actuator 100 is attached to the housing 50 via its cylinder body 101, the state of which is not shown, and its operation rod 102 is engaged with the corresponding third roller chock 90 with the vertical movement of the third roller chock 90 permitted.

An intermediate roller increasing bender 110 is interposed between each third roller chock 90 and the support bracket 52, and an intermediate roller decreasing bender 120 is interposed between each third roller chock 90 and each second roller chock 70.

Figures 5A, 5B:
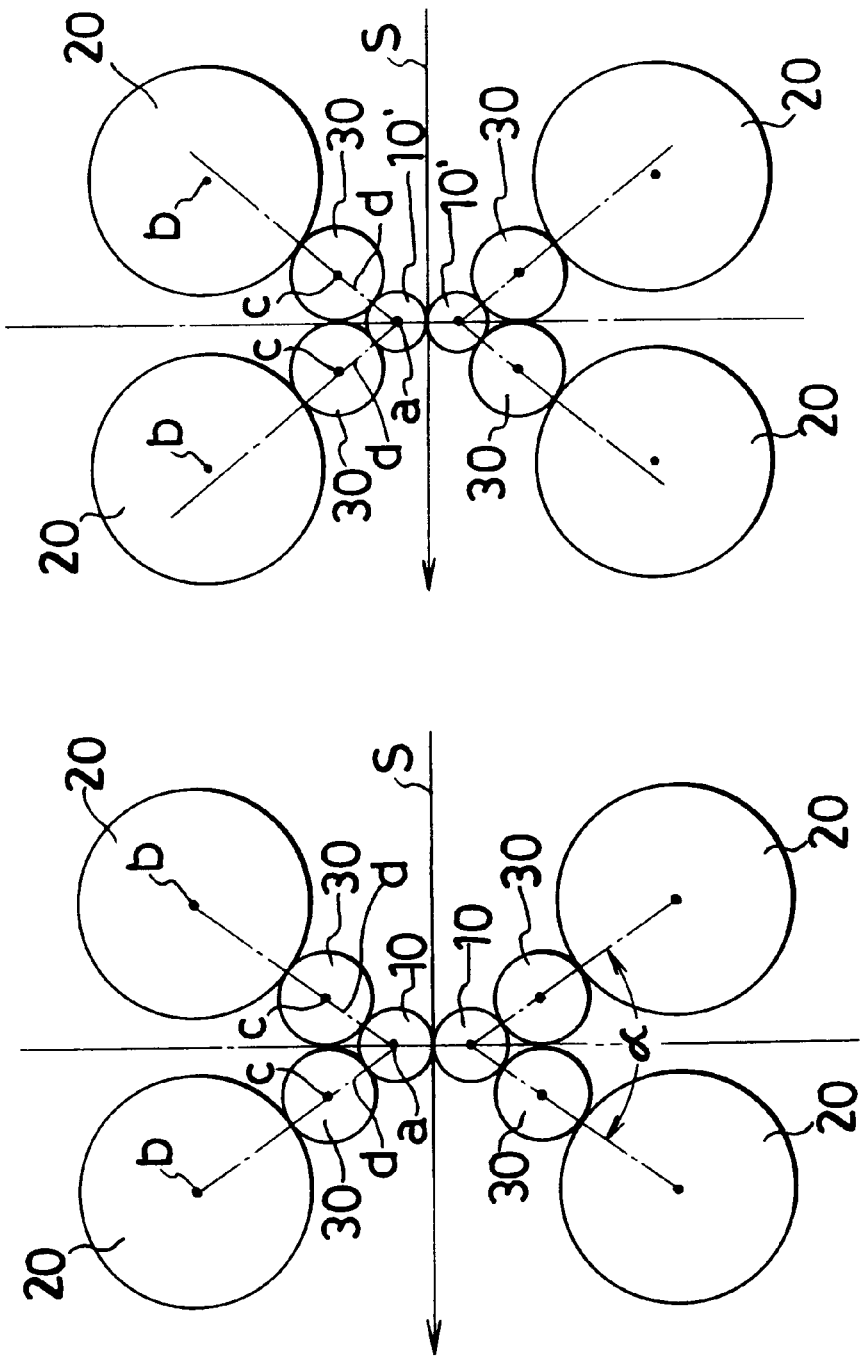
FIG. 5(a) is a schematic front view showing the arrangement of the rollers of the rolling mill for metal foil in FIG. 1, with work rollers set in their initial state.
FIG. 5(b) is a schematic front view showing the arrangement of the rollers, with the work rollers used and then polished to a reduced diameter.

FIG. 5 illustrates the typical arrangement of the pair of upper and lower work rollers 10, two pairs of upper and lower backup rollers 20 and two pairs of upper and lower intermediate rollers 30 in the ten-high rolling mill for metal foil according to this embodiment of the present invention.

FIG. 5(*a*) illustrates the arrangement in which the work rollers 10 are in their initial state wherein the axis b of each backup roller 20 is positioned on an extension of the line d connecting the axis a of a work roller and the axis c of a contacting intermediate roller 30. By driving the hydraulic cylinder actuator 80, roll load can be exerted onto each work roller 10 via the pair of backup rollers 20 and the pair of intermediate rollers 30.

FIG. 5(*b*) illustrates the arrangement in which the work rollers 10 were used and then polished into work rollers 10' with a smaller diameter wherein the axes b of each pair of upper and lower backup rollers 20 are positioned within the region of the interior angle formed by lines d connecting the axis a of a work roller 10' and the axes c of the pair of contacting intermediate rollers 30. Also in this case, roll load can be exerted onto each work roller 10' via the pair of backup rollers 20 and the pair of intermediate rollers 30 by driving the hydraulic cylinder actuator 80.

Figure 8:
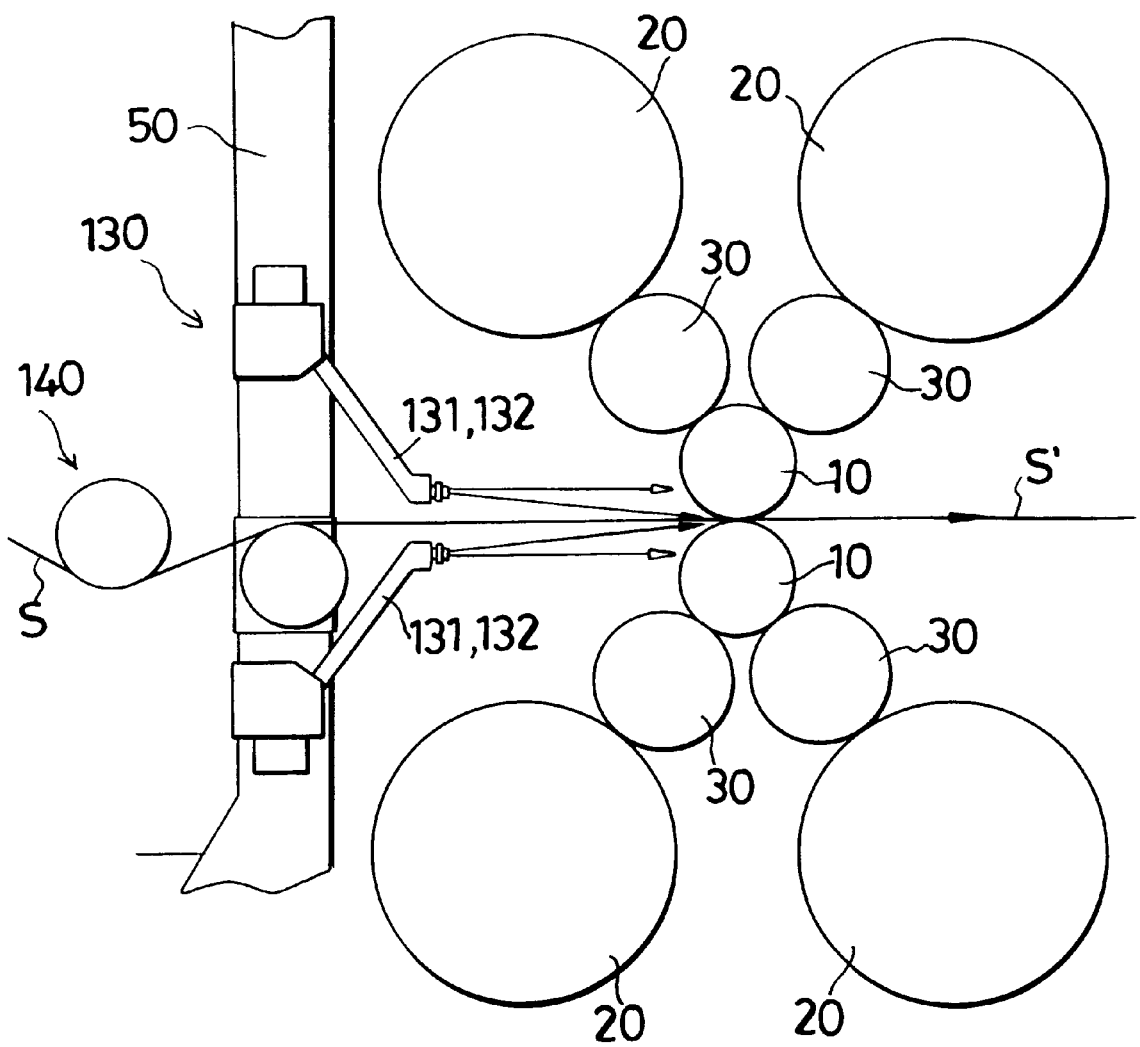
FIG. 8 is an enlarged view showing the principal part of the arrangement of nozzles for jetting a coolant to the rollers.

The ten-high rolling mill for metal foil is provided with oil jetting means 130 and unwinding guide means 140 on the upstream side of the pair of upper and lower work rollers 10 as shown in FIG. 8 and with rewinding guide means 150 on the downstream side thereof as shown in FIG. 1.

The oil jetting means 130 comprises a plurality of low-temperature oil jetting nozzles 131 from which coolant oil (cooling-lubricating oil) of relatively low temperature (20 to 40° C.) is jetted onto the outer peripheries of the cylindrical bodies 12 of the work rollers 10 and a plurality of high-temperature oil jetting nozzles 132 from which coolant oil of relatively high temperature (40 to 60° C.) is jetted onto the outer peripheries of the cylindrical bodies 12, that are alternately arranged equidistantly, e.g. at intervals of 50 mm, along the axes of the work rollers 10. The low-temperature oil jetting nozzles 131 are connected to a low-temperature oil storage tank 135 via individual flow rate control valves 133 and a pump 134, and the high-temperature oil jetting nozzles 132 are connected to a high-temperature oil storage tank 138 via individual flow rate control valves 136 and a pump 137. As is clear from FIG. 8, each of the oil jetting nozzles 131 and 132 has its base end retained on the housing 50 and its jetting port facing the outer peripheral surface of the work roller 10. While the high-temperature oil jetting nozzles 132 are set so that the coolant oil can be jetted onto the parts of the work rollers close to the path line for a material S to be rolled, the low-temperature oil jetting nozzles 131 are set so that the coolant oil can be jetted onto the parts of the work rollers slightly apart from the path line for the material S to be rolled.

The unwinding guide means 140 is for guiding between the work rollers 10 a sheet material S to be rolled, that is wound on a unwinder 141, and the rewinding guide means 150 is for guiding to a rewinder 151 a rolled product S' that has passed between the work rollers 10. Each of the two means is constituted of a plurality of guide rollers 160 disposed side by side. As is clear from FIG. 1, the unwinder 141 is disposed in the vicinity of the work rollers 10 on the upstream side of the work rollers 10, with a part thereof on which the material S to be rolled is wound positioned inside the housing 50. The rewinder 151 is disposed also in the vicinity of the work rollers 10 but on the downstream side of the work rollers 10. As one example of the arrangement of the guide rollers 160 constituting the unwinding guide means 140, they can be disposed at distances of not more than 3.5 times, not more than 5 times and not more than 6.5 times the diameter of the work rollers 10, respectively, from the work rollers 10 in order from closer to the work rollers 10. As one example of the arrangement of the guide rollers 160 constituting the rewinding guide means 150, they can be disposed at distances of not more than 3.5 times, not more than 5 times and not more than 6.5 times the diameter of the work rollers 10, respectively, from the work rollers 10 in order from closer to the work rollers 10.

Figure 9:
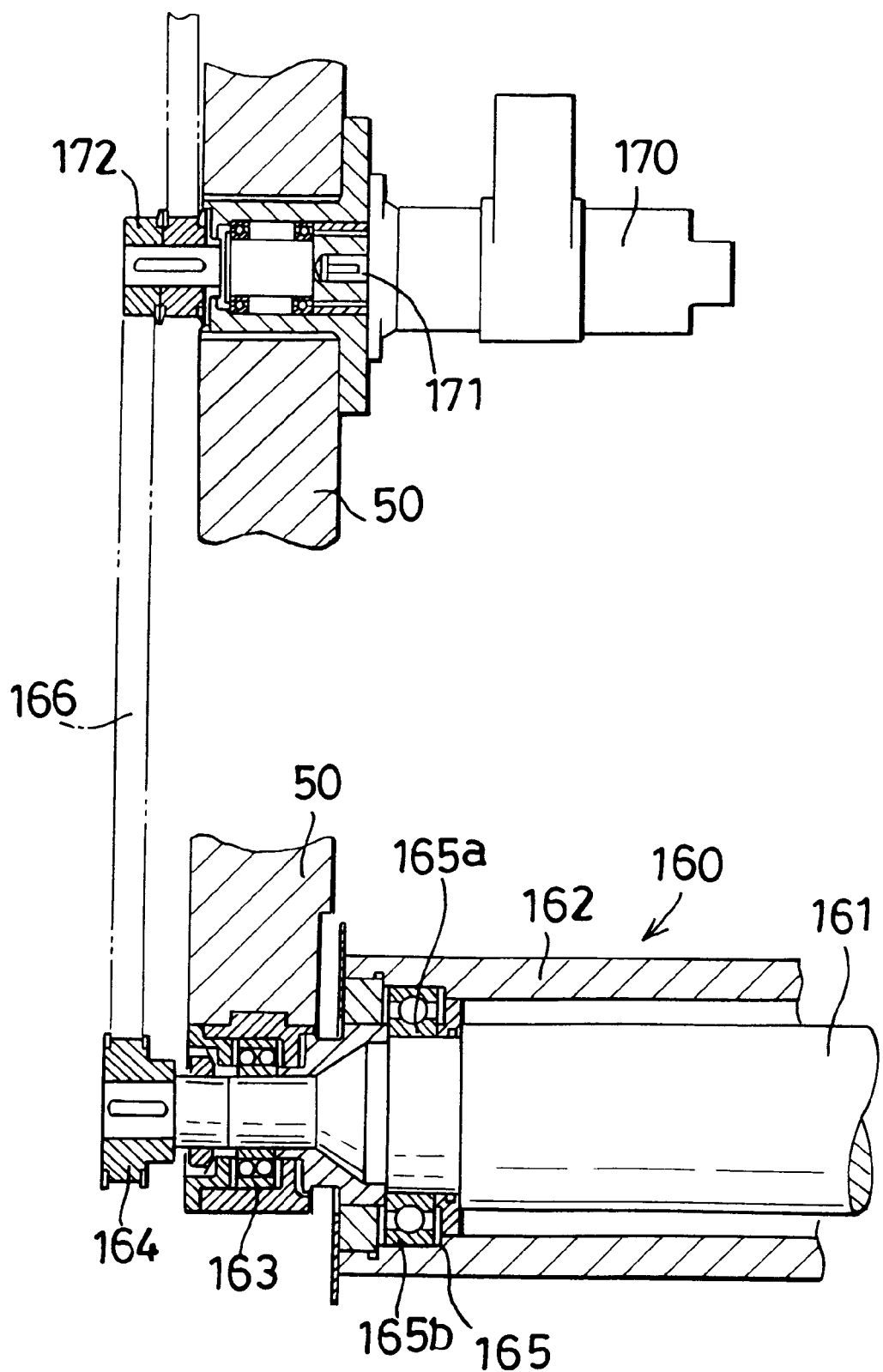
FIG. 9 is a cross section showing a drive mechanism for guide rollers.
Figure 10A:
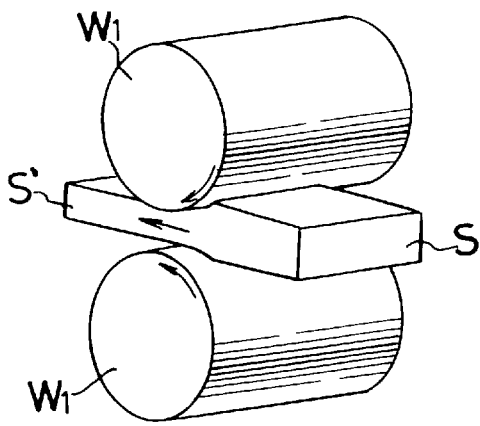
FIG. 10(a) is a perspective view showing a typical prior art two-high rolling mill.
Figure 10B:
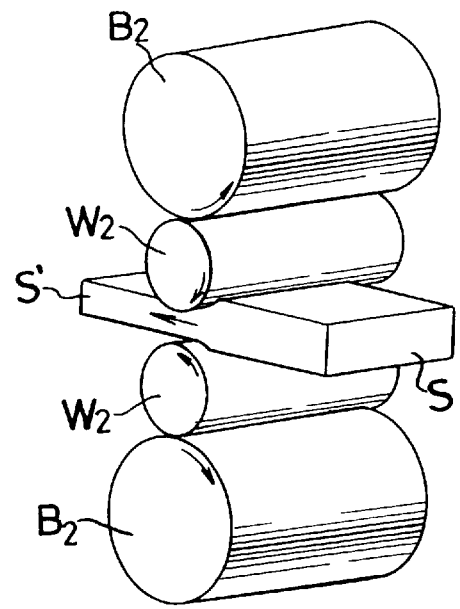
FIG. 10(b) is a perspective view showing a typical prior art four-high rolling mill.
Figure 10C:
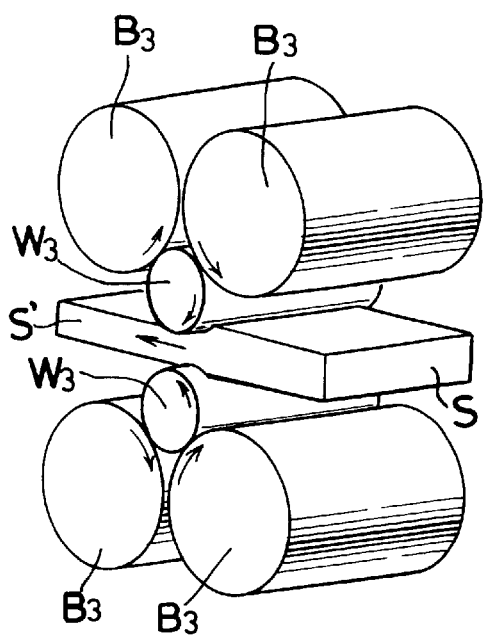
FIG. 10(c) is a perspective view showing a typical prior art six-high rolling mill.
Figure 10D:
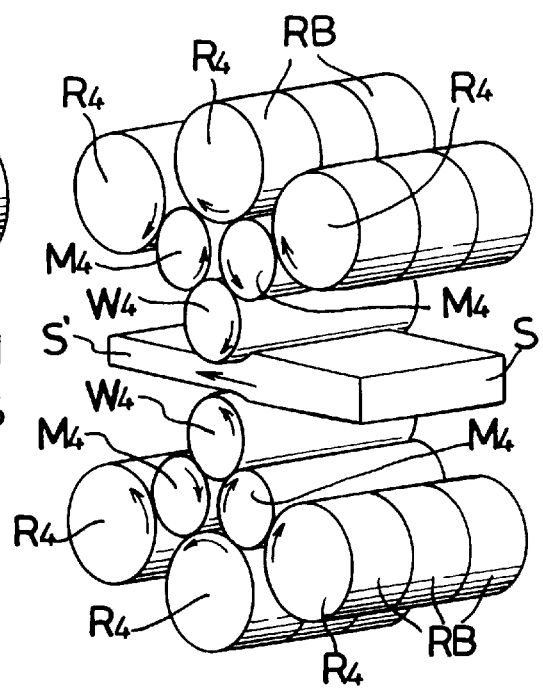
FIG. 10(d) is a perspective view showing a typical prior art twelve-high rolling mill.

Typically, each guide roller 160 has a dual structure comprising a center shaft 161 and a hollow roller 162 as shown in FIG. 9. The center shaft 161 is rotatably supported on the housing 50 or a bracket not shown but formed on the housing via a bearing 163, with its axis held in parallel to the axes of the work rollers 10, and is provided on one end thereof projecting from the bearing 163 with a driven pulley 164. The hollow roller 162 is cylindrical, has an inside diameter larger than the diameter of the center shaft 161, and is rotatably supported in a region of the outer circumference of the center shaft 161 via an indirect drive bearing 165 interposed between itself and the center shaft 161.

A timing belt 166 is stretched between the driven pulley 164 for each guide roller 160 and a drive pulley 172 fixed to an output shaft 171 of an air motor 170 and serves to transmit the rotation force of the air motor 170 to the individual driven pulleys 164.

In the guide roller 160, the rotation force of the air motor 170 generated by driving the air motor is transmitted to the driven pulley 164 via the drive pulley 172 and timing belt 166 to directly drive the center shaft 161. The rotation of the center shaft 161 rotates an inner race 165*a* of an indirect drive bearing 165, an outer race 165*b* of the indirect drive bearing 165 is then synchronized with the rotation of the inner race, and eventually the hollow roller 162 is indirectly rotated. Since the indirect rotation of the hollow roller 162 is independent of the direct rotation of the center shaft 161, it can be instantly stopped by an external force irrespective of the state of rotation of the center shaft 61.

One of the constituents of the rewinding guide means 150, a guide roller 160' disposed at the downstream extremity in this embodiment, serves also as a roller for detecting the shape of the rolled product S'. The guide roller 160' is provided with a plurality of load measuring devices, not shown, between the center shaft 161 and the hollow roller 162 and serves to detect the shape of the rolled product S' on the basis of radial load distribution detected by the load measuring devices.

FIG. 6 illustrates a metal foil thickness controller applied to the ten-high rolling mill for metal foil in this embodiment. The operation of the ten-high rolling mill for metal foil will be described with reference to FIG. 6.

In the ten-high rolling mill, by actuating the hydraulic cylinder actuator 80 so that it elongates, roll load can be imparted to the pair of upper and lower work rollers 10 via the associated pairs of backup rollers 20 and pairs of intermediate rollers 30. With the roll load imparted, therefore, a sheet material S to be rolled can be subjected to strip processing by supplying the sheet material S wound beforehand on the unwinder 141 between the work rollers 10 via the unwinding guide means 140. A rolled product S' that has passed between the work rollers 10 is guided to and wound on the rewinder 151 via the rewinding guide means 150. In the ten-high rolling mill, the work rollers 10 can be rotated directly or indirectly via the rotation of the intermediate rollers 30.

During the rotation of the work rollers, a main control unit 200 of the metal foil thickness controller constantly monitors a thickness deviation of the rolled product S' ascertained from output signals produced by the shape detecting roller 160', causes a display 201 to visibly display thereon the thickness deviation, and sends control signals to a shift cylinder control unit 202, a bender control unit 203 and a valve control unit 204 so that the thickness deviation can be brought to zero.

Figure 4:
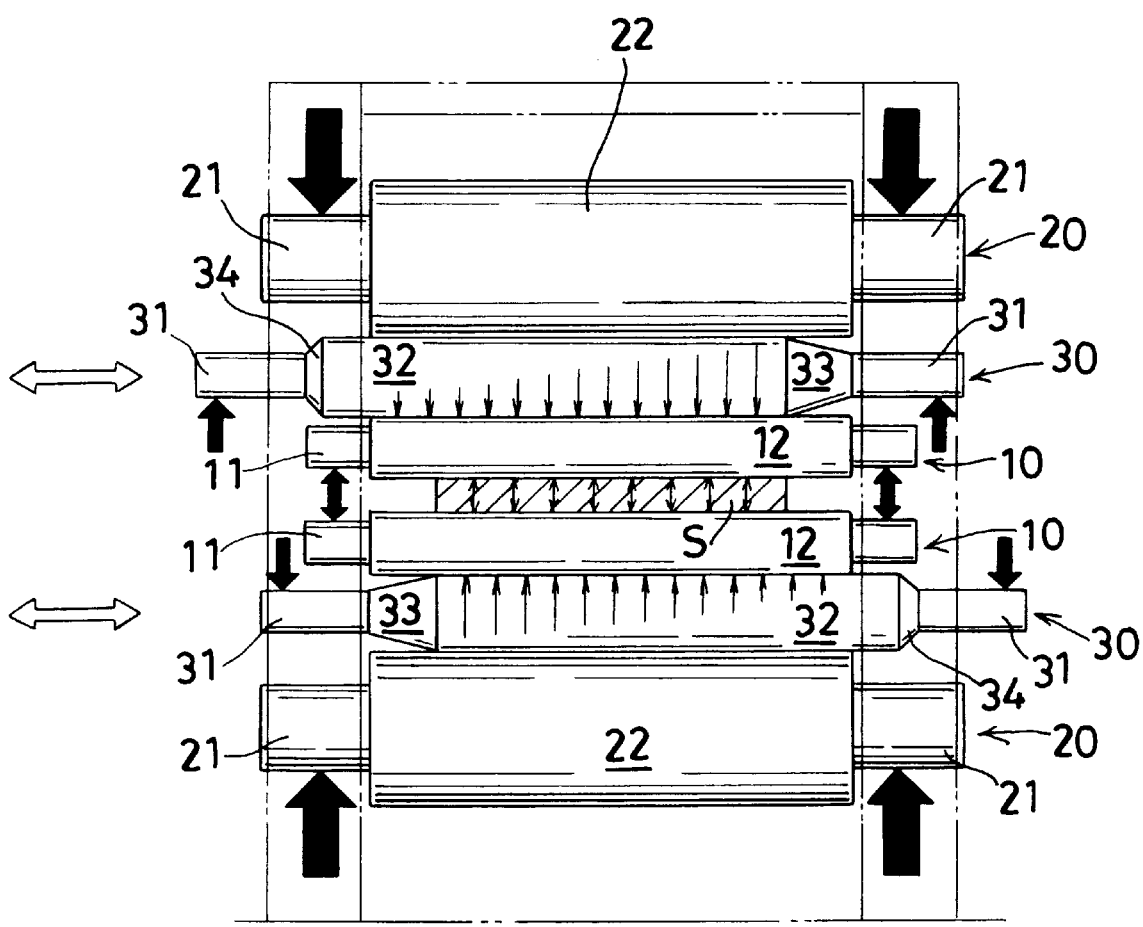
FIG. 4 is a side view showing the arrangement of the rollers of the rolling mill for metal foil in FIG. 1.

To be specific, the shift cylinder control unit 202 effects control for actuating the shift cylinder actuator 100 so that the upper intermediate rollers 30 and lower intermediate rollers 30 are shifted by a suitable amount in the opposite directions on the basis of the control signals from the main control unit 200 and controls the variation in length of contact between the work rollers 10 and the intermediate rollers 30 in accordance with the thickness deviation in the sheet material S supplied between the pair of work rollers 10 (cf. FIG. 4).

The bender control unit 203 controls the work roller increasing bender 60, intermediate roller increasing bender 110 and intermediate roller decreasing bender 120 to be appropriately driven on the basis of the control signals from the main control unit 200 and controls the flexure of the work rollers 10 and intermediate rollers 30 due to the roll load (thickest arrows in FIG. 4) to be suppressed by pushing the necks 11 of the work rollers 10 in the opposite directions (two-way arrows in FIG. 4) and simultaneously pushing the necks 31 of the intermediate rollers 30 appropriately along the upward and downward directions (thick arrows in FIG. 4), respectively.

The valve control unit 204 drives the flow rate control valves 133 and 136 of the oil jetting means 130 on the basis of the control signals from the main control unit 200 to appropriately change the temperature and flow rate of the coolant oil, thereby controlling the amount of the crown of each work roller 10 utilizing contraction and expansion resulting from the temperature change of the work roller 10.

As a consequence, uniform roll load can be imparted to the overall width direction area of the sheet material S supplied between the pair of work rollers 10. According to the ten-high rolling mill for metal foil, therefore, it becomes possible to obtain a rolled product S' having a uniform thickness in the width direction.

In the ten-high rolling mill for metal foil having the aforementioned roller arrangement, since each pair of intermediate rollers 30 are interposed between a work roller 10 and a pair of backup rollers 20, even when the backup rollers 20 are formed to have a diameter large enough to ensure their rigidity, the distance between the backup rollers 20 across the path line for the sheet material S is sufficiently large. Therefore, there is no possibility of the backup rollers 20 opposed across the path line making contact with each other, and it is possible to make the work rollers smaller in diameter and to dispose the unwinding guide means 140 and rewinding guide means 150 in the immediate vicinity of the work rollers 10.

Furthermore, since the interior angle $\alpha$ formed by the lines connecting the axis a of each work roller 10 and the axes b of the associated backup rollers 20 can be set acute owing to the interposition of the intermediate rollers 30, the reaction force of the roll load exerted onto the backup rollers 20 and intermediate rollers 30 is small. This is advantageous in the aspect of controlling the roll load and prevents the bearing portions of the intermediate rollers 30 from damage at an early stage.

Moreover, since the number or weight of the rollers concerned in the strip processing is small in comparison with that of the conventional twelve-high rolling mill, the mechanical loss and inertial-weight influence become smaller. This enables easy and accurate drive control.

According to the ten-high rolling mill for metal foil, therefore, it is possible to sufficiently meet demand for a rolled product S' having a thickness of 9 to 3 $\mu$m and a width exceeding 750 mm. This can contribute to the formation of multilayered, small-thickness printed circuit boards and the production of small-sized, high-capacity, long service-life secondary batteries and highly integrated semiconductors.

In addition, in the ten-high rolling mill for metal foil, since the high-temperature oil jetting nozzles 132 and low-temperature oil jetting nozzles 131 are disposed in the immediate vicinity of the work rollers 10, the coolant oil can be jetted onto the work rollers 10 without being excessively scattered. This enables the temperature and flow rate of the coolant oil jetted onto the work rollers 10 to be controlled with higher accuracy.

Furthermore, the unwinding guide means 140 and rewinding guide means 150 are constituted each of the center shaft 161 and the hollow roller 162 that is indirectly driven.

Therefore, the influence of the force of inertia on the sheet material S and the rolled product S' can be minimized. Even when the unwinding or rewinding speed has varied or when air has been entrained in wound turns of the rolled product S' to cause a discrepancy between the speed of the rolled product S' wound and the peripheral speed of the rewinder 151, it is possible to minimize the probability of the rolled product S' being severed and to make the speed of the sheet material S being supplied high (not less than 600 m/min).

Even if the rolled product S' should be severed, since the number of the rollers concerned in the strip processing is small in comparison with the twelve-high rolling mill, operation is easy to restore.

Since the unwinder 141 and rewinder 151 are disposed close to the work rollers 10, the distance the sheet material or rolled product travels therebetween is small. This prevents the sheet material S or rolled product S' from being wrinkled or severed due to its elongation.

As a result, the ten-high rolling mill for metal foil enables easy mass production of extremely thin large-width metal foil having a thickness of 9 to 3 $\mu$m and a width exceeding 750 mm.

In the embodiment described above, since the air motor is used as drive means for the guide rollers, there is no possibility of oil coolant supplied from the oil jetting means being ignited. However, the drive means for the guide rollers is not limited to the air motor.

Since individual nozzles are used for oil coolants of different temperatures, the embodiment is advantageous from the standpoint of temperature response. However, the oil coolants of different temperatures can be jetted alternatively from one same jetting nozzle.

What is claimed is:

1. A rolling mill for metal foil having a thickness of 9 to 3 μm, comprising:

a pair of work rollers having axes in parallel to each other for subjecting a sheet material being supplied therebetween to strip processing;

two pairs of intermediate rollers arranged so that the intermediate rollers of each pair are in contact with one of the work rollers and have axes in parallel to the axis of the contacting work roller;

two pairs of backup rollers arranged so that the backup rollers of each pair are respectively in contact with one pair of the intermediate rollers;

each of the work rollers and each pair of contacting intermediate rollers being disposed so that an interior angle formed by connecting the axis of each work roller and the axes of each pair of contacting intermediate rollers is acute; and the axes of each pair of backup rollers falling within a range of the acute interior angle;

whereby each pair of intermediate rollers and the pair of backup rollers impart roll load to the work roller.

2. The rolling mill for metal foil according to claim 1, wherein the pair of intermediate rollers of each pair are movable in their axial direction.

3. The rolling mill for metal foil according to claim 1, further comprising an unwinder on which a material to be rolled is wound and a rewinder on which a rolled product is to be wound, that are disposed close to the pair of work rollers on an upstream side and a downstream side of the pair of work rollers, respectively.

4. The rolling mill for metal foil according to claim 1, further comprising coolant jetting means disposed in an immediate vicinity of the pair of work rollers on an upstream side of the pair of work rollers.

5. The rolling mill for metal foil according to claim 3, further comprising first guide means for the material disposed between the unwinder and the pair of work rollers and in an immediate vicinity of the pair of work rollers and second guide means for the product disposed between the rewinder and the pair of work rollers and in an immediate vicinity of the pair of work rollers.

6. The rolling mill for metal foil according to claim 3, further comprising first guide means for the material disposed between the unwinder and the pair of work at a distance of not more than 3.5 times a diameter of the pair of work rollers from the pair of work rollers, and second guide means for the product disposed between the rewinder and the pair of work rollers at a distance of not more than 3.5 times a diameter of the pair of work rollers from the pair of work rollers.

7. The rolling mill for metal foil according to claim 5, wherein each of the first and second guide means includes a guide roller comprising a center shaft and a hollow roller surrounding the center shaft and disposed rotatably relative to the center shaft.

8. The rolling mill for metal foil according to claim 6, wherein the coolant jetting means comprises a plurality of first jetting means for a coolant of relatively high temperature and a plurality of second jetting means for a coolant of relatively low temperature.

9. The rolling mill for metal foil according to claim 8, wherein the first and second jetting means are arranged alternately along the axes of the pair of work rollers.

10. A rolling mill for metal foil, comprising:

a pair of work rollers having axes in parallel to each other for subjecting a sheet material being supplied therebetween to strip processing;

two pairs of intermediate rollers arranged so that the intermediate rollers of each pair are in contact with one of the work rollers and have axes in parallel to the axis of the contacting work roller;

two pairs of backup rollers arranged so that the backup rollers of each pair are respectively in contact with one pair of the intermediate rollers;

an unwinder on which a material to be rolled is wound and which is disposed on an upstream side of the pair of work rollers;

a rewinder on which a rolled product is to be wound and which is disposed on a downstream side of the pair of work rollers;

a first guide roller for the material disposed between the unwinder and the pair of work rollers;

a second guide roller for the product disposed between the rewinder and the pair of work rollers; and each of the first and second guide rollers comprising a center shaft and a hollow roller surrounding the center shaft and disposed rotatably relative to the center shaft;

whereby minimizing a probability that the metal foil is severed when wind speeds of the unwinder and the rewinder change.

11. A rolling mill for metal foil, comprising:

a pair of work rollers having axes in parallel to each other for subjecting a sheet material being supplied therebetween to strip processing;

two pairs of intermediate rollers arranged so that the intermediate rollers of each pair are in contact with one of the work rollers and have axes in parallel to the axis of the contacting work roller;

two pairs of backup rollers arranged so that the backup rollers of each pair are respectively in contact with one pair of the intermediate rollers, whereby each pair of intermediate rollers and the pair of backup rollers in contact with the pair of intermediate rollers impart roll load to the work roller in contact with the pair of intermediate rollers; and a plurality of first jetting means for a coolant of high temperature and a plurality of second jetting means for a coolant of low temperature that are disposed on an upstream side of the pair of work rollers and arranged alternately along the axes of the pair of work rollers.

* * * * *